United States Patent
Fallahi et al.

(10) Patent No.: US 6,930,519 B2
(45) Date of Patent: *Aug. 16, 2005

(54) FREQUENCY DIVISION/MULTIPLICATION WITH JITTER MINIMIZATION

(75) Inventors: Siavash Fallahi, Newport Coast, CA (US); Myles Wakayama, Laguna Niguel, CA (US); Pieter Vorenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 10/782,890

(22) Filed: Feb. 23, 2004

(65) Prior Publication Data

US 2004/0169534 A1 Sep. 2, 2004

Related U.S. Application Data

(63) Continuation of application No. 10/227,259, filed on Aug. 26, 2002, now Pat. No. 6,714,056, which is a continuation of application No. 09/736,612, filed on Dec. 14, 2000, now Pat. No. 6,441,655.
(60) Provisional application No. 60/170,621, filed on Dec. 14, 1999.

(51) Int. Cl.[7] .............................................. H03K 23/00
(52) U.S. Cl. ...................... 327/115; 327/150; 327/151; 331/16; 331/25; 377/48
(58) Field of Search ................................ 327/115, 117, 327/150, 151, 156, 159, 160, 105–107; 331/1 A, 16, 18, 25, 57, 74; 377/48, 47

(56) References Cited

U.S. PATENT DOCUMENTS

| | | | |
|---|---|---|---|
| 5,081,655 A | | 1/1992 | Long .......................... 331/14 |
| 5,889,436 A | * | 3/1999 | Yeung et al. ................... 331/2 |
| 6,044,123 A | | 3/2000 | Takla .......................... 327/163 |
| 6,157,694 A | | 12/2000 | Larsson ........................ 377/48 |
| 6,181,213 B1 | | 1/2001 | Chang .......................... 331/34 |
| 6,441,655 B1 | * | 8/2002 | Fallahi et al. ................ 327/115 |

FOREIGN PATENT DOCUMENTS

| | | |
|---|---|---|
| EP | 1 045 518 A1 | 10/2000 |
| GB | 2 325 803 A | 12/1998 |
| WO | WO 90/06017 | 5/1990 |

OTHER PUBLICATIONS

Mills, "Phase–Locked Loops," Printed from the McGraw–Hill Multimedia Encyclopedia of Science & Technology, Copyright © 1998, The McGraw–Hill Companies, Inc., pp. 1–5.

Snow, "Frequency Divider," Printed from the McGraw–Hill Multimedia Encyclopedia of Science & Technology, Copyright © 1998, The McGraw–Hill Companies, Inc., pp. 1–2.

(Continued)

*Primary Examiner*—Timothy P. Callahan
*Assistant Examiner*—An T. Luu
(74) *Attorney, Agent, or Firm*—Sterne, Kessler, Goldstein & Fox P.L.L.C

(57) ABSTRACT

A method and system described for producing frequency multiplication/division by any non-integer output signal frequency relative to a reference signal frequency of a Phase Lock-Loop (PLL), while simultaneously maintaining low jitter. In one embodiment, the invention increases the number of the available clock phases to M and then shifts the output clock phase by one, every K/M cycle. In one aspect of the present invention, this is accomplished by adding a multiplexer (MUX) to the output of the PLL to implement the phase shifting every K/M cycles. In another aspect, the MUX is placed in the feedback loop of the PLL. In one embodiment, a quantizer is used to drive the MUX.

16 Claims, 15 Drawing Sheets

OTHER PUBLICATIONS

Black et al., "Pulse Modulation," Printed from the McGraw–Hill Multimedia Encyclopedia of Science & Technology, Copyright © 1998, The McGraw–Hill Companies, Inc., pp. 1–10.

Alley, "Frequency–Modulation Detector," Printed from the McGraw–Hill Multimedia Encyclopedia of Science & Technology, Copyright © 1998, The McGraw–Hill Companies, Inc., pp. 1–4.

Black et al., "Amplitude Modulation," Printed from the McGraw–Hill Multimedia Encyclopedia of Science & Technology, Copyright © 1998, The McGraw–Hill Companies, Inc., pp. 1–5.

Curtin et al., "Phase–Locked Loops for High–Frequency Receivers and Transmitters—Part 1," *ADI—Analog Dialogue,* vol. 33, No. 3, Mar., 1999, pp. 1–9, http://www.analog.com/publications/magazines/Dialogue/archives/33–03/phase/.

International Search Report, PCT/US00/33908, Dec. 1999, 4 pages.

\* cited by examiner

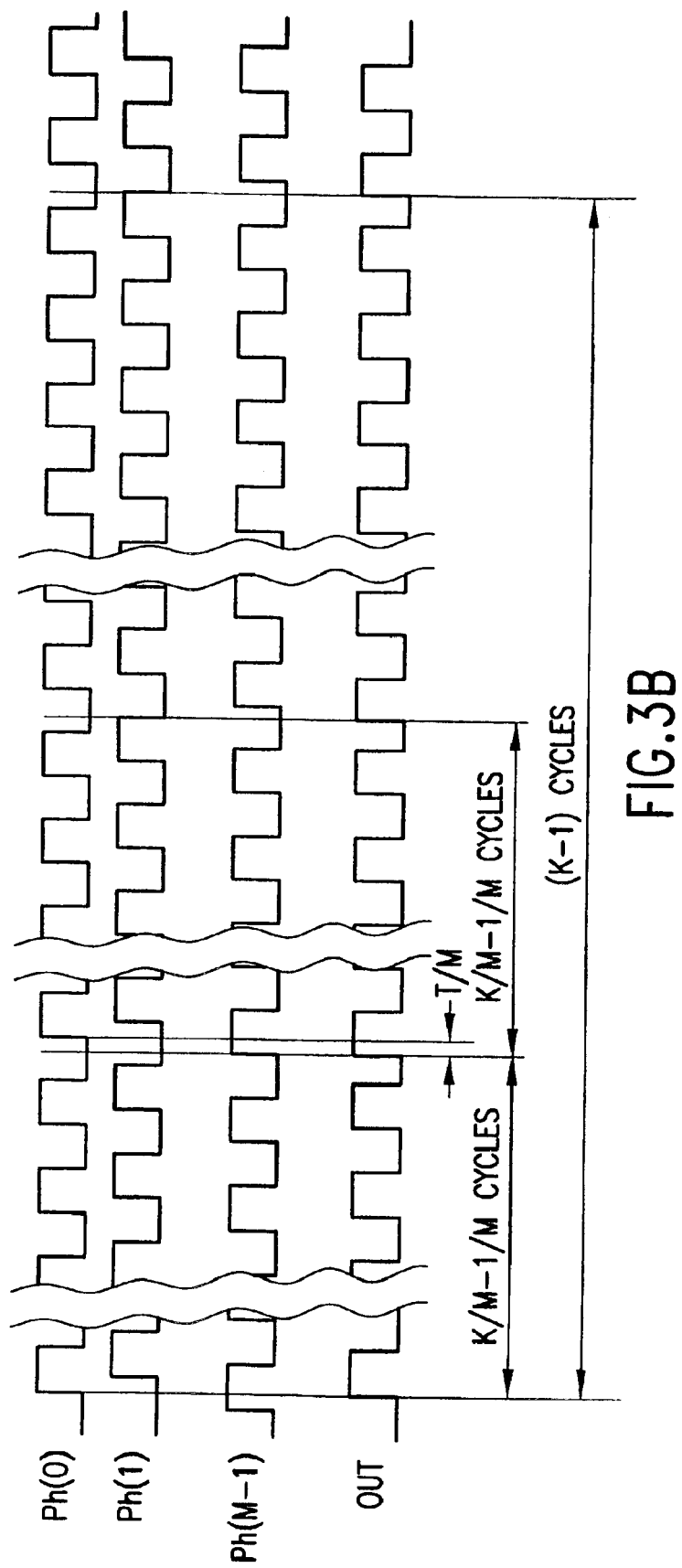

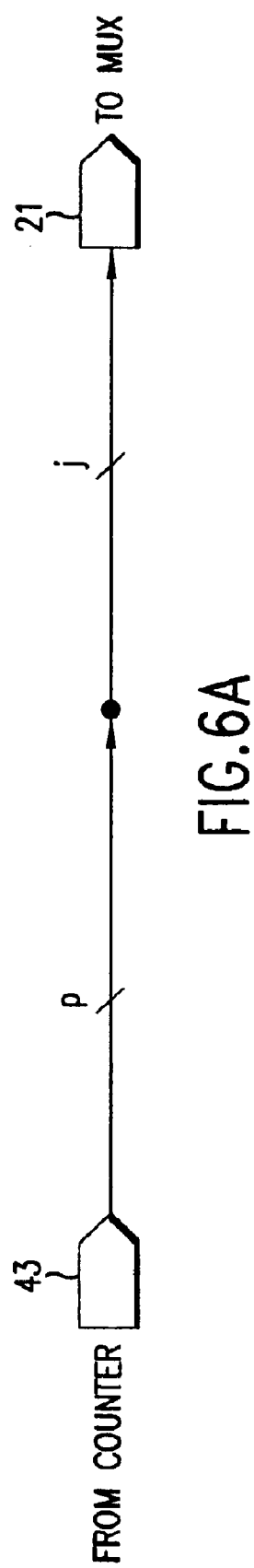

FREQUENCY DIVISION/MULTIPLICATION WITH JITTER MINIMIZATION

CROSS-REFERENCE TO RELATED APPLICATIONS

This application is a continuation of U.S. Ser. No. 10/227,259, filed Aug. 26, 2002 (now U.S. Pat. No. 6,714,056 that issued Mar. 30, 2004), which is a continuation of U.S. Ser. No. 09/736,612, filed Dec. 14, 2000 (now U.S. Pat. No. 6,441,655 B1), which claimed benefit under 35 U.S.C. §119(e) to U.S. Provisional Patent Application Ser. No. 60/170,621, filed Dec. 14, 1999, entitled "Frequency Division/Multiplication With Jitter Minimization," which are all incorporated by reference herein in their entireties.

BACKGROUND OF THE INVENTION

1. Field of the Invention

The present invention is directed to a system for and a method of dividing or multiplying a reference frequency signal by a non-integer number while minimizing the introduction of timing jitter to the resultant output frequency signal.

2. Related Art

The past several years have witnessed a dramatic increase the capabilities of high-speed, high-density, broadband data communication systems. Such systems may range anywhere from broadcast or cablecast HDTV systems, local area and wide area network (LAN, WAN) systems, fiber to the home (FTTH) applications and board-to-board interconnections in exchange systems and computers.

In any one of the foregoing applications, it should be noted that bidirectional data communication is in digital form and, accordingly, clock and data recovery circuitry is a key component of the efficient functioning of modem data communications systems. The ability to regenerate binary data is an inherent advantage of transmitting information digitally as opposed to transmitting such information in analog form. However, in order for the intelligence signal to be correctly reconstructed at the receiving end, the transmitted binary data must be regenerated with the fewest possible number of bit errors, requiring low noise and timing jitter (phase noise) at the clock generation source. In high speed data communication systems, low jitters are important for ensuring low error rates.

Clock signal generation is traditionally performed by a Phase-Lock-Loop (PLL) system such as that illustrated in FIG. 1. A PLL operates to compare the frequency and/or phase of an incoming serial datastream to a periodic reference clock signal generated by an oscillator circuit, and to adjust the operational frequency and phase characteristics of the oscillator until its output stream is "locked" in both frequency and phase to the data signal. Frequency division and/or frequency multiplication can be used to generate multiple clock phases from a PLL.

FIG. 1 shows a typical PLL circuit that is used to perform a frequency signal multiplication (or division) function. A reference signal ("IN") is applied to one input of the Phase/Frequency Detector 10 where the phase and frequency of a feedback clock from a divider circuit 19 is compared. The Phase/Frequency detector 10 circuit outputs signals 16 & 18 to the charge pump circuit 12 indicating whether the feedback clock from the divider circuit is lower or higher in frequency and ahead or behind in phase. The charge pump converts the signals from the Phase/Frequency detector typically into analog current signals that are filtered by the Filter 13. The filtered signal is then output to the Voltage Controlled Oscillator (VCO) 14 which produces an output signal which is typically the output of the PLL ("OUT"). The output signal of the VCO is input to the divider circuit 19, which divides the frequency of the output signal by an integer "N" in this example. The output signal of the divider circuit is input to the phase detector circuit completing the PLL. In this case, the output signal of the PLL is limited to integer multiples of the reference signal.

Non-integer multiply functions for the overall PLL can be implemented by placing a divider circuit (e.g., divide by D) at the output of the PLL thereby, dividing the output signal by D. This results in FOUT=FIN×N/D, where N/D is a non-integer number. However, when N becomes a large number, the frequency of the VCO may become unpractically large. Non-integer multiply/divide functions can also be implemented by designing the divider circuit 19 of FIG. 1A to appropriately suppress predetermined clock cycles to its input signal at a specific rate defined by a number "K", thereby decreasing its effective divide ratio by K+1/K. FIG. 1B is an exemplary timing diagram for a conventional non-integer division. As shown, every K cycles, one cycle of the OUT signal is suppressed, resulting in K cycles in K+1 periods. Therefore, the frequency of the OUT signal, FOUT=Number of cycles/Time=K/(K+1). T, where T is the period for VCO. Thus, FOUT=FVCO×K/(K+1), that is dividing FVco by K+1/K.

However, these technique adversely cause large changes in the period of the output of the divider circuit introducing jitter to the output of the PLL. This jitter is as large as the period of the suppressed cycle, i.e., the period of the output signal of the PLL. This large jitter is very undesirable for most systems as described previously.

A non-monolithic implementation that can accomplish this function is commonly known as a VCXO. By applying a control voltage to a VCXO circuit its output signal frequency can be changed, or as commonly referred to, "pulled" to a desired frequency in the order of Å 1000 ppm or less from its natural frequency. However, this implementation is very complex and costly.

Accordingly, prior art-type PLL circuits do not provide an integrated, low-cost, and simple frequency division/multiplication with low jitter. Accordingly, for high-speed PLLs, there is a demonstrated need for a frequency division/multiplication with low jitter which is designed and constructed such that jitters are substantially minimized.

SUMMARY OF THE INVENTION

The present invention enables full flexibility to produce frequency multiplication/division by any non-integer output signal frequency (for example, (K+1)/K, or K/(K−1)) relative to a reference signal frequency, while simultaneously maintaining low jitter performance.

In one embodiment, the invention shifts the phase of the OUT signal by one phase, every K/M cycle. In another embodiment, the invention increases the number of the available clock phases to M and then shifts the phase of the OUT signal by one phase, every K/M cycle. In one aspect of the present invention, this is accomplished by adding a multiplexer (MUX) to the output of the PLL to implement the phase shifting every KIM cycles. In another embodiment, the MUX is placed in the feedback loop of the PLL. In yet another embodiment, a quantizer is used to drive the MUX resulting in further minimization of noise.

In one aspect, the present invention describes an integrated low jitter frequency multiplication/division electronic circuit for multiplying/dividing frequency of a reference signal comprising: a PLL for generating M number of clock phases from the reference signal; and a signal shifter electrically coupled to the PLL for shifting the reference signal by one phase every K/M cycle, wherein (K+1)/K is a divisor number and K/(K−1) is a multiplier number.

In another aspect, the present invention describes a method for multiplying/dividing frequency of a reference signal comprising the steps of generating M number of clock phases; and shifting the reference signal by one phase every K/M cycle, wherein (K+1)/K is a divisor number and K/(K−1) is a multiplier number. In yet another aspect, the present invention describes a frequency division electronic circuit for dividing frequency of a reference signal by a non-integer number (K+1)/K, comprising: PLL for generating M number of clock phases from the reference signal; and a signal shifter electrically coupled to the PLL for shifting the reference signal by one phase every K/M cycle.

BRIEF DESCRIPTION OF THE FIGURES

These and other features, aspects, and advantages of the present invention will be more fully understood when considered with respect to the following detailed description, appended claims, and accompanying drawings.

FIG. 3B is a series of timing diagrams illustrating the timing of the output signal in FIG. 2 for a frequency multiplication in accordance to one embodiment of the present invention.

FIG. 6A is a simplified representation of a truncator used as a quantizer in accordance to one embodiment of the present invention.

DETAILED DESCRIPTION OF THE INVENTION

Figure 3A:
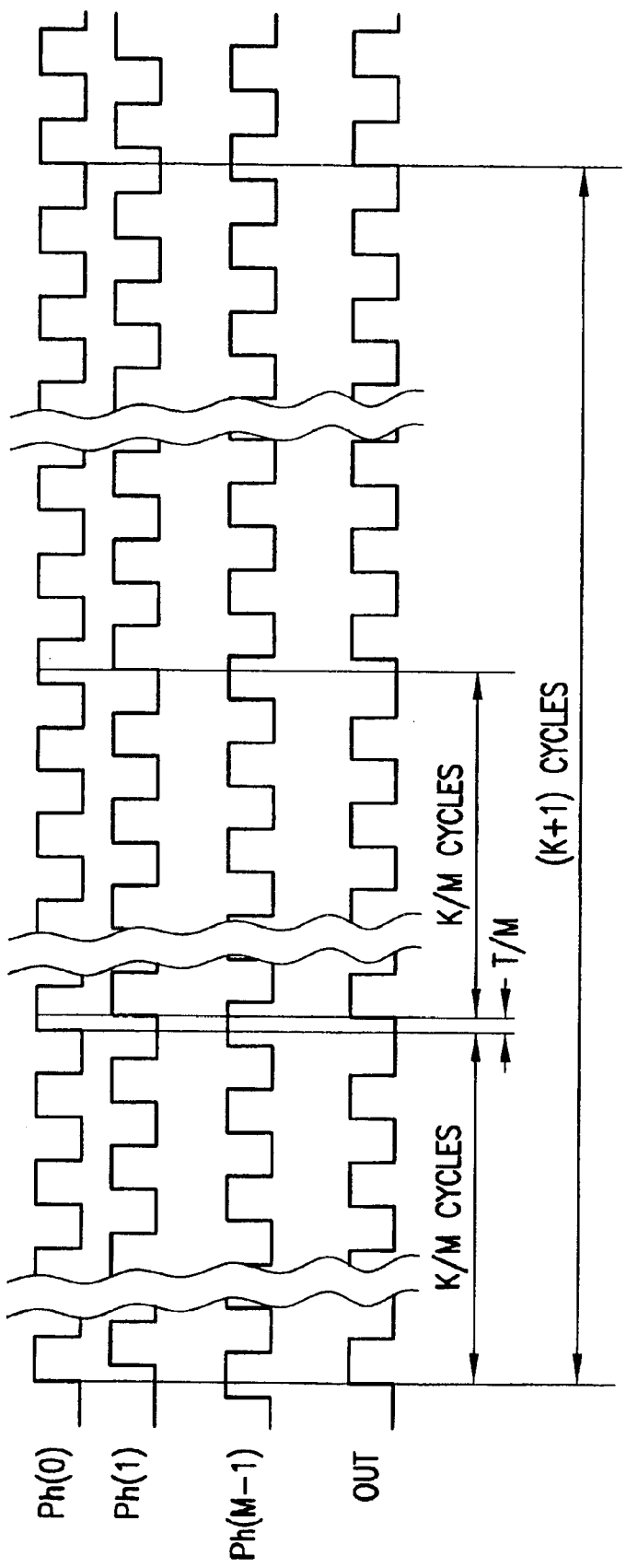
FIG. 3A is a series of timing diagrams illustrating the timing of the output signal in FIG. 2 for a frequency division in accordance to one embodiment of the present invention.

The present invention minimizes jitters caused by frequency multiplication/division by a number of jitter reduction schemes and different combinations of those schemes. In one embodiment, to divide a frequency by a non-integer number such as (K+1)/K, the, invention increases the number of the available clock phases to M and then shifts the output clock by one, every K/M cycle. Similarly, a frequency multiplication by a non-integer number such as K/(K−1) can be achieved by increasing the number of the available clock phases to M and then shifting the output clock in an opposite way by one, every K/M cycle. This technique of frequency division/multiplication decreases the jitter from T to T/M, resulting in a jitter improvement by a factor of M, because the discarded cycle is now 1/M of the original cycle. Exemplary timing diagrams for this technique of frequency division/multiplication are illustrated in FIG. 3A and 3B, respectively. The shifting function may be performed by a MUX or any other signal shifter.

Figure 1A:
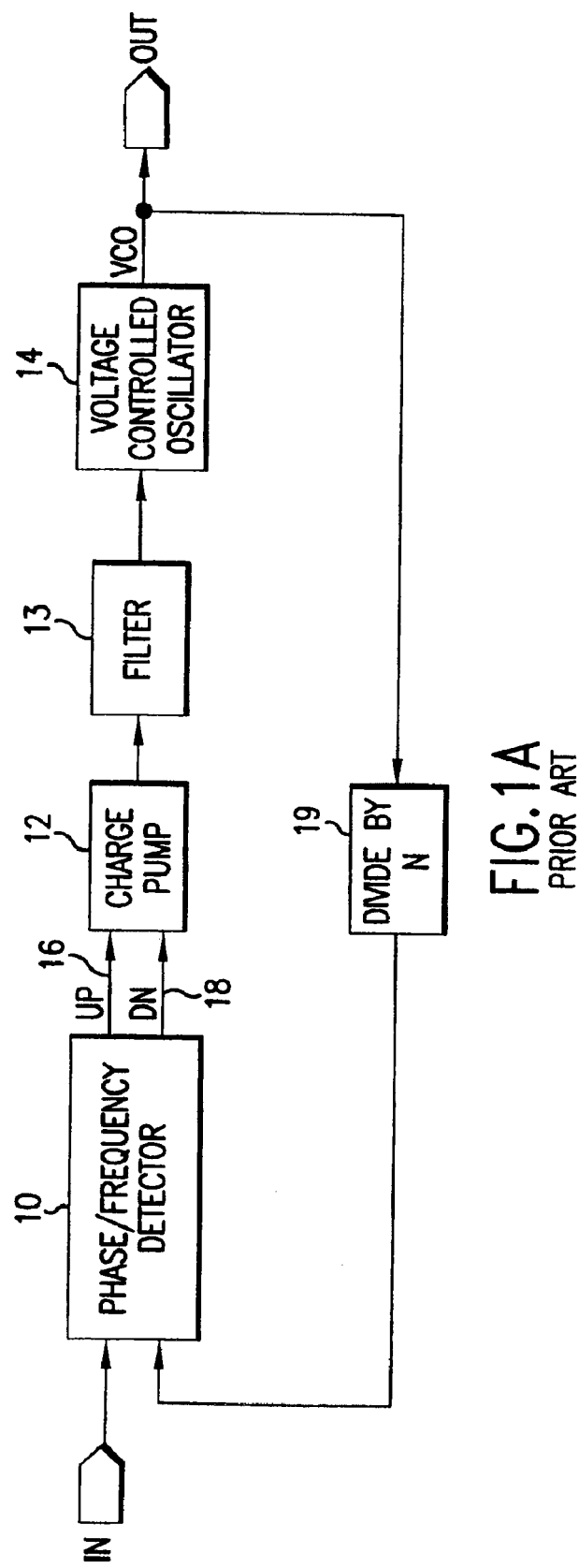
FIG. 1A is a semi-schematic simplified block diagram of a PLL, in accordance with the prior art.
Figure 1B:
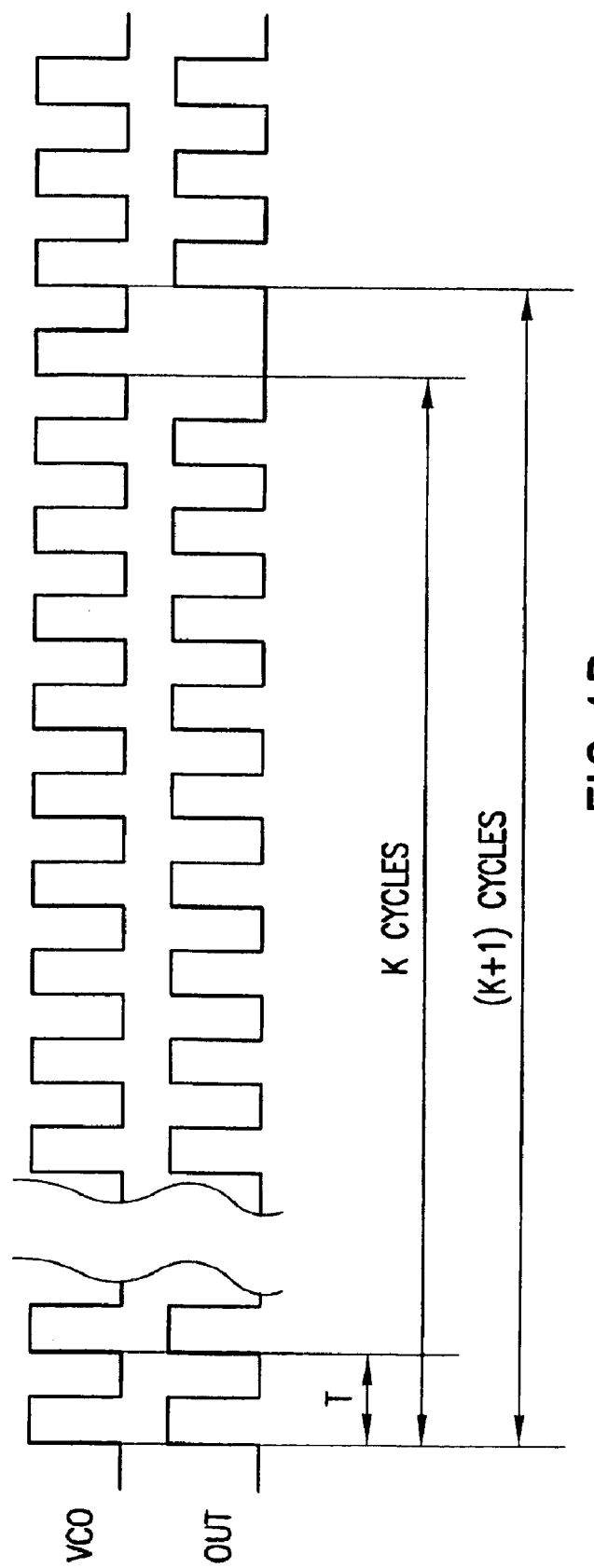
FIG. 1B is an exemplary timing diagram for a conventional non-integer division.
Figure 2:
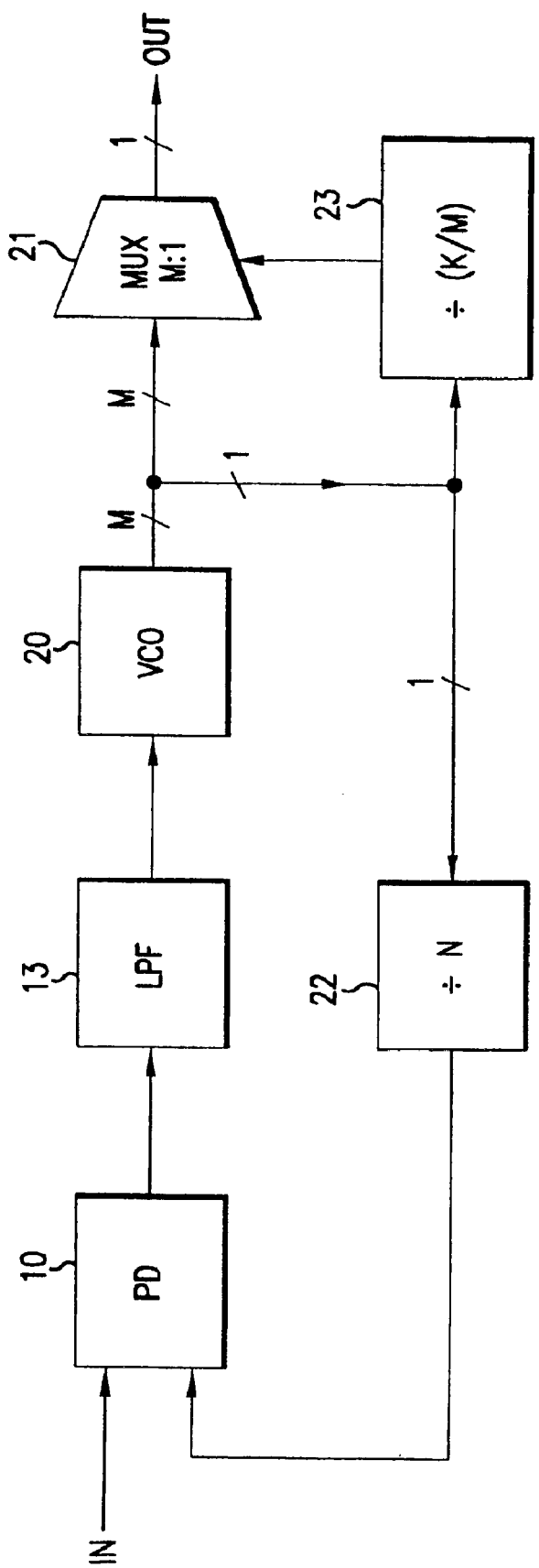
FIG. 2 is a semi-schematic simplified circuit diagram of a modified PLL in accordance to one embodiment of the present invention.

FIG. 2 shows an exemplary implementation of this scheme. In this embodiment, VCO 20 is capable of producing M phases of clocks. MUX 21 is added to the output of the VCO to implement the phase shifting every K/M cycles. Counter 23 controls the select signals for MUX 21 and the feedback clock is divided by N in clock 22. Note that, for simplicity reasons, the charge pump 12 of FIG. 1A is included in PD 10 of FIG. 2.

FIG. 3A is a simplified timing diagram for the circuit of FIG. 2 for performing frequency division. As shown by OUT signal, after K/M cycles, the MUX switches from phase PH0 to phase PH1 and thus the first pulse of OUT signal is extended to the next phase, i.e., phase PH1, producing a phase shift of T/M. After K/M cycles, the MUX next switches from phase PH1 to phase PH2. This repeats every KIM cycles. After K cycles, the MUX goes through all the phases from phase PH0 to phase PH(M−1) and back to phase PH0 producing K cycles in (K+1)*T seconds. This increases the period from T to T+T/K=T*(K+1)/K, and thus divides the frequency by (K+1)/K. Consequently, the jitter is reduced to T/M because the suppressed cycle is now only T/M.

Figure 3C:
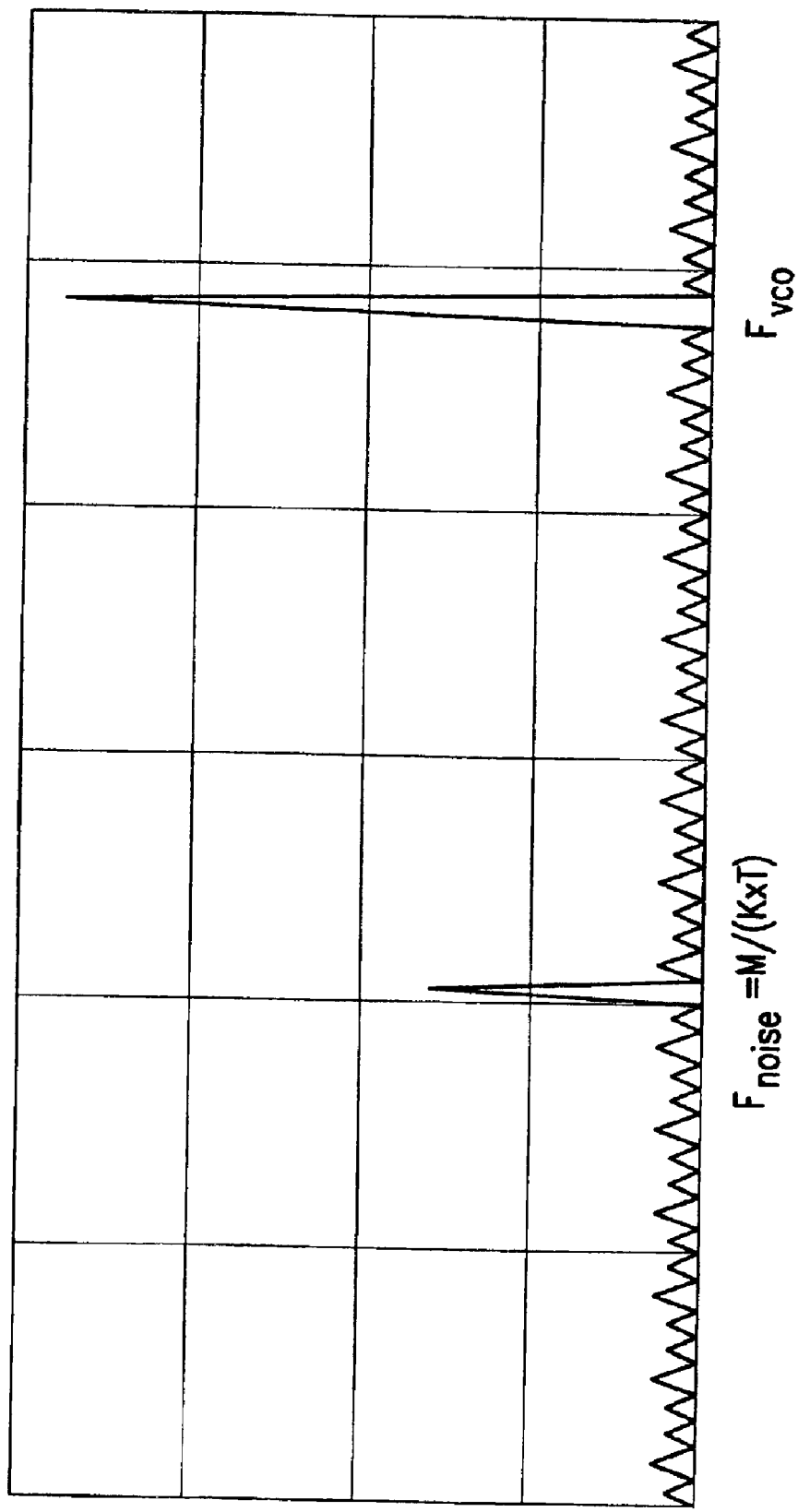
FIG. 3C is a noise spectrum diagram in accordance to one embodiment of the present invention.

It is to be understood that while the above example illustrates shifting up the clock by T/M, the scope of the invention also includes shifting down the clock by T/M, i.e., changing the direction of shifting and reducing the period from T to T−T/M every K/M cycles resulting in K cycles in (K−1)*T seconds. This multiplies the frequency by K/(K−1), as shown in FIG. 3B. FIG. 3C shows a noise spectrum diagram for the resulting jitter. As depicted in FIG. 3C, the frequency of noise is related to how often the phase is shifted, that is the value of M. Also, the energy of the noise is related to the jitter.

Figure 3D:
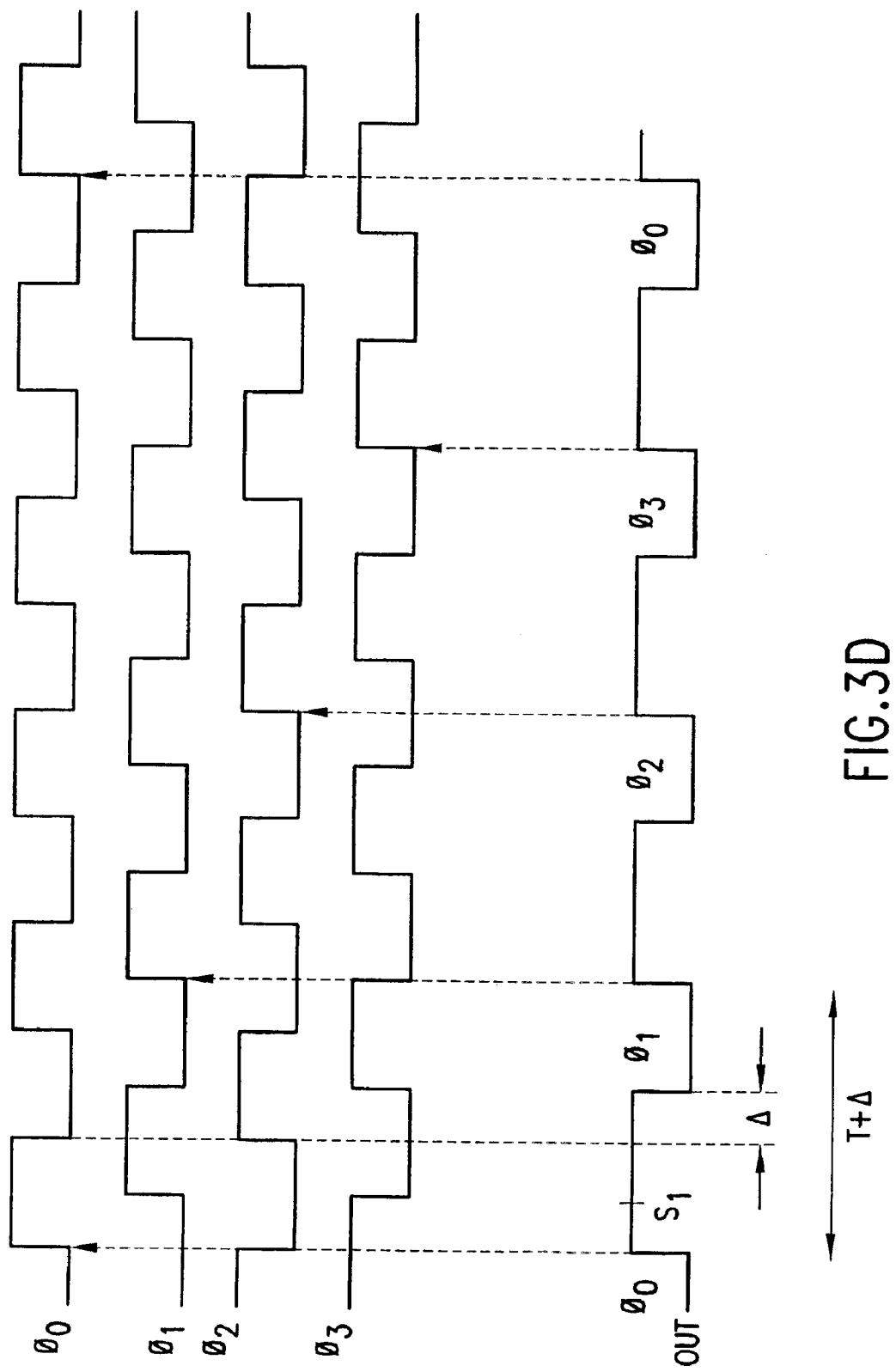
FIG. 3D is a series of timing diagrams illustrating the timing of the output signal in FIG. 2 for M=4.

FIG. 3D is a simplified timing diagram for the circuit of FIG. 2, where M=4. As shown by OUT signal, after K/4 cycles, at time s1, the MUX switches from PH0 to PH1 and thus the first pulse of OUT signal is extended to the next phase, i.e., phase PHI, producing a phase shift of, wherein =T/4. After K/4 cycles, the MUX next switches from phase PH1 to phase PH2. This repeats every K/4 cycles. After K cycles, the MUX goes through all the phases from phase PH0 to phase PH3 and back to phase PH0 resulting in K cycles in (K+1)T seconds. This increases the period from T to T+T/4 and divides the frequency by (K+1)/K. Consequently, the jitter is reduced to T/4.

Figure 4:
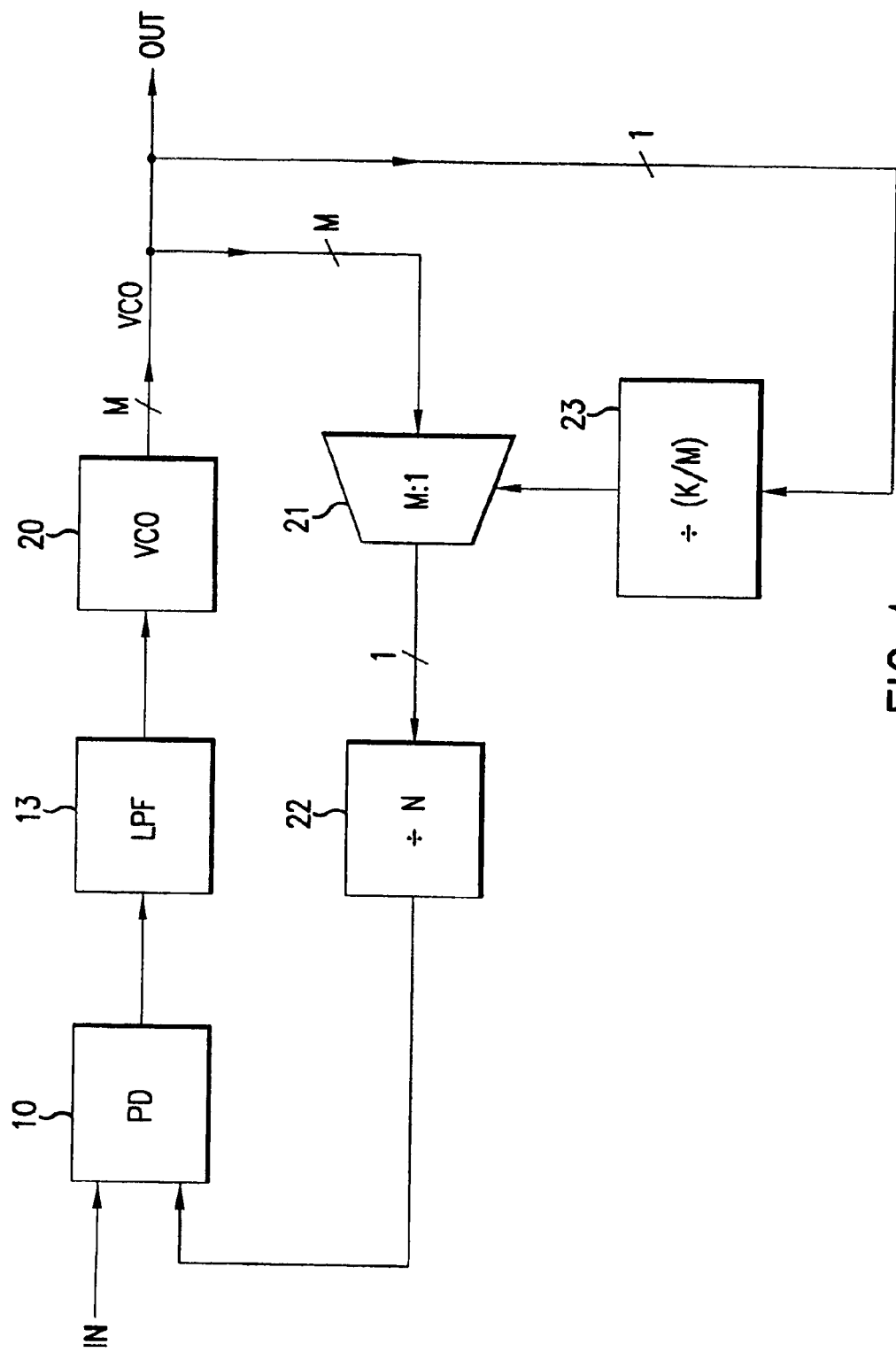
FIG. 4 is a semi-schematic simplified circuit diagram of a modified PLL in accordance to one embodiment of the present invention.

In one embodiment, MUX 21 of FIG. 2 may be placed in the feedback loop of the PLL, i.e., between VCO 20 and PD 10, as shown by MUX 21 in FIG. 4. The input of the MUX 21 is driven by a divide-by-K/M circuit 23 to select one out of M inputs of the MUX. In other words, this scheme feeds back the output of the phase shift to PD 10 through the low pass filter 13 and thus smoothes the clock transition when the phase is shifted from 2 phase PH (k) to phase PH (k±1), resulting in low jitter generation at the output of the VCO. In this embodiment, the jitter energy is further reduced by the low pass filter of the PLL.

Figure 5:
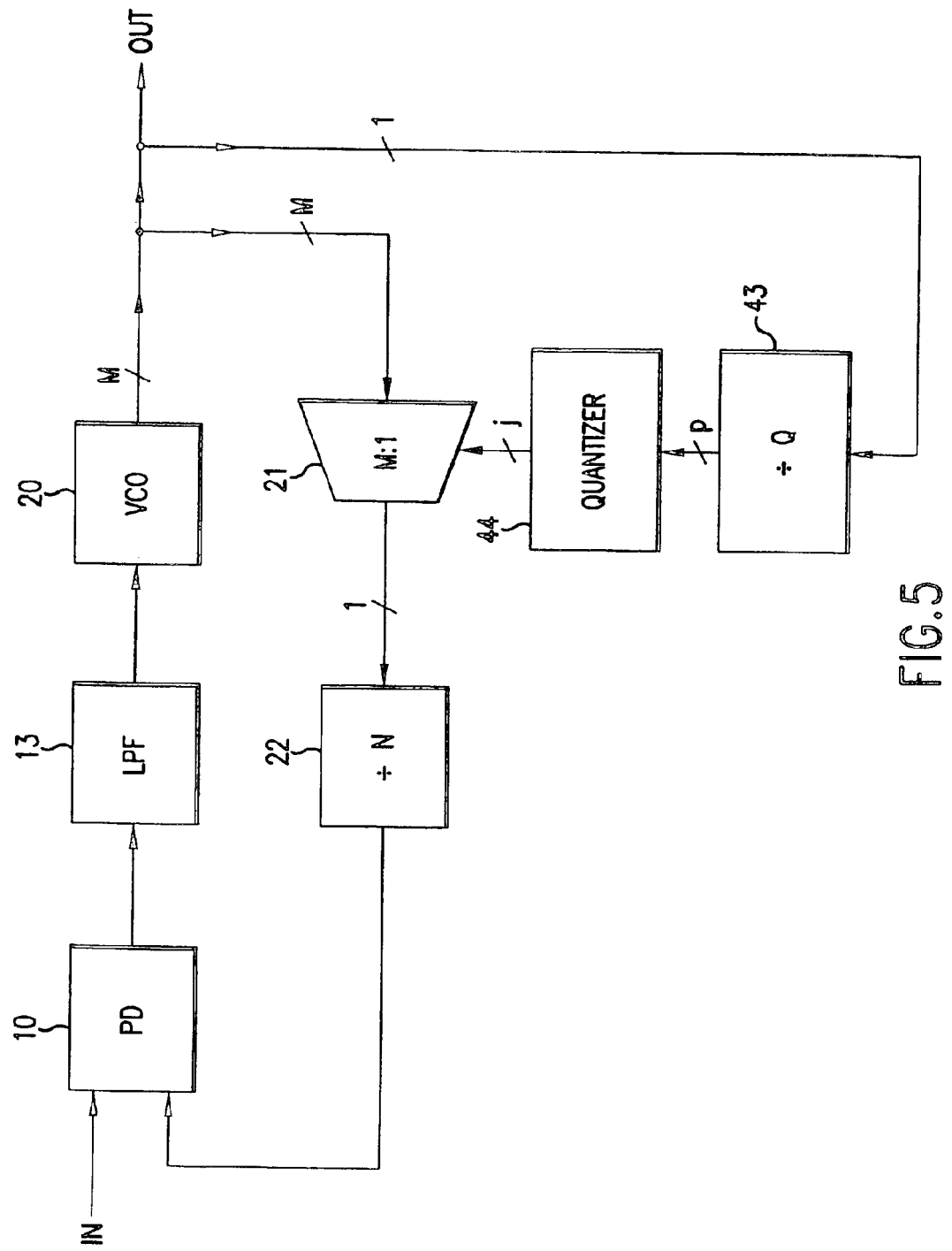
FIG. 5 is a semi-schematic simplified circuit diagram of a modified PLL in accordance to one embodiment of the present invention.
Figure 6B:
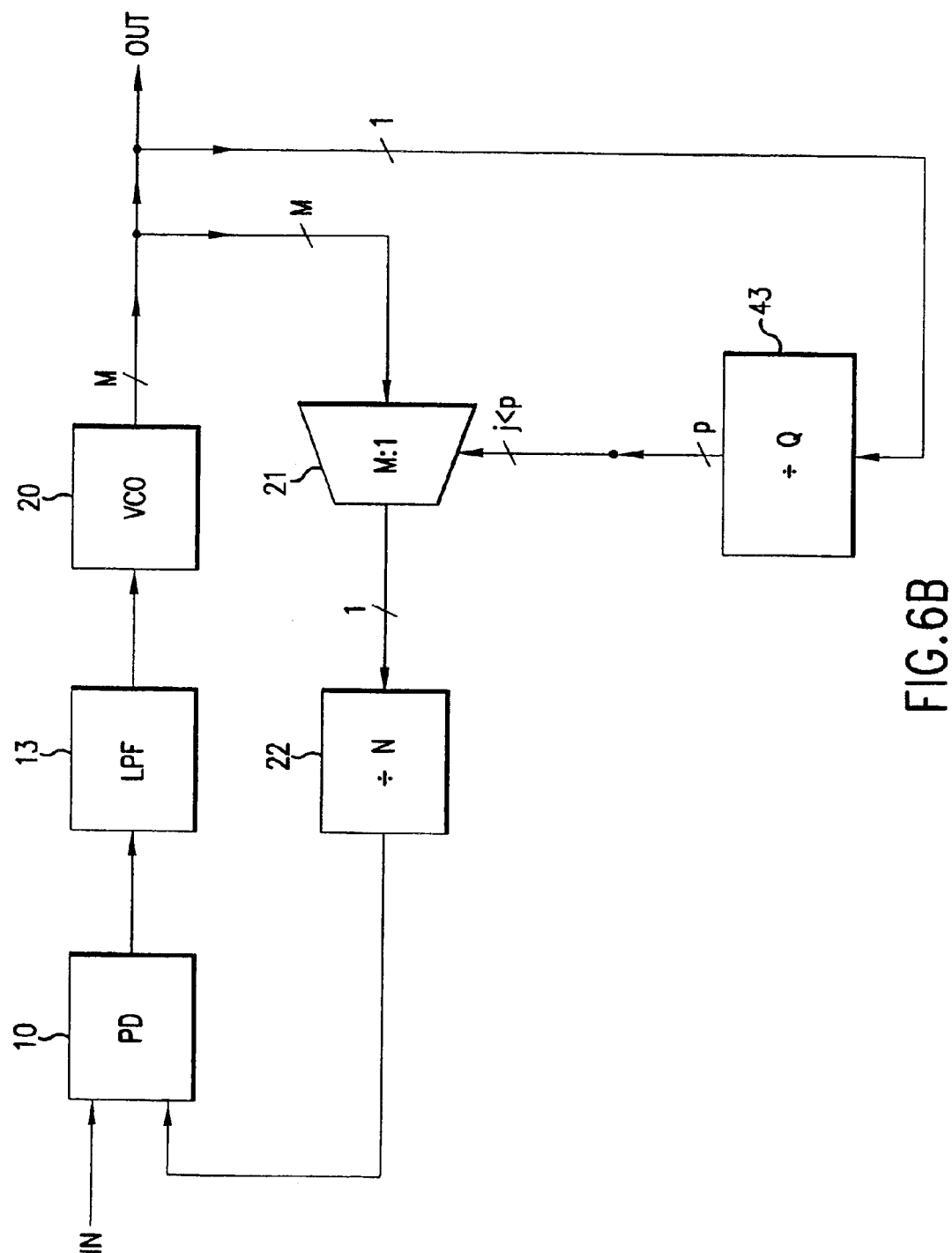
FIG. 6B is a semi-schematic simplified circuit diagram of a modified PLL using the truncator of FIG. 6A.

The above scheme may be enhanced by using various quantizers as illustrated in FIG. 5. The output of the divide-by-Q 43 is quantized by quantizer 44 to drive MUX 21 selector. A truncator may used as a quantizer, as shown in FIG. 6A. In this scheme, the j MSB bits of the counter are used to drive the MUX 21, where $2^j$=M. FIG. 6B is a simplified circuit diagram of the modified PLL using the truncator of FIG. 6A. In one embodiment, the quantizer is used in combination with the modified PLL of FIG. 2, where the MUX is not in the feedback loop of the PLL.

Figure 7A:
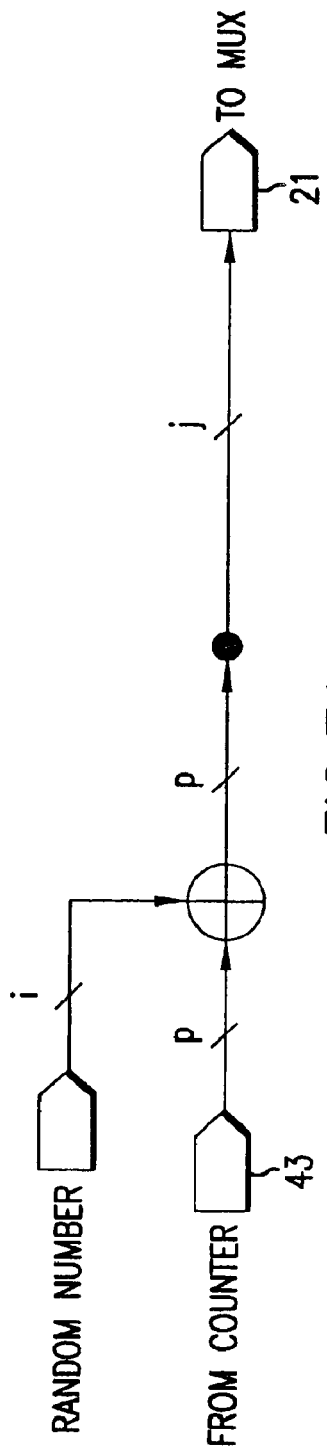
FIG. 7A is a simplified representation of a random number generator used as a quantizer in accordance to one embodiment of the present invention.

FIG. 7A shows another example of a quantizer used in one embodiment of the present invention. In this example, a random number generator generates a random number to be added to the value of the counter, resulting in shifting the phase in random. In one embodiment, the random number is added to the value of the counter at a specific time. In another embodiment, at random time intervals, one is added to or subtracted from the value of the counter. The addition and subtraction of one at random time intervals should average out as zero.

Figure 7B:
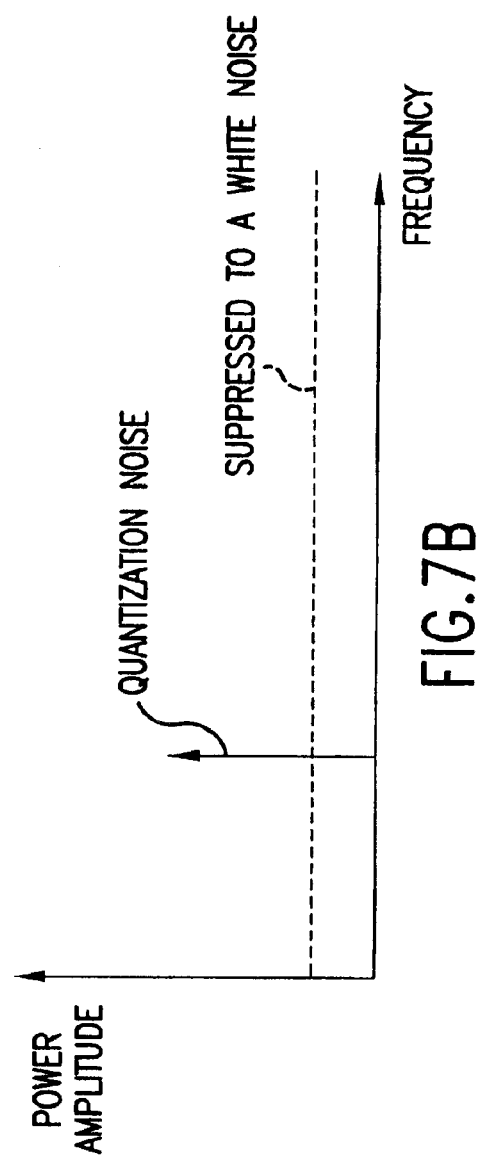
FIG. 7B is a simplified plot of frequency vs. noise energy for the quantizer of FIG. 7A.
Figure 7C:
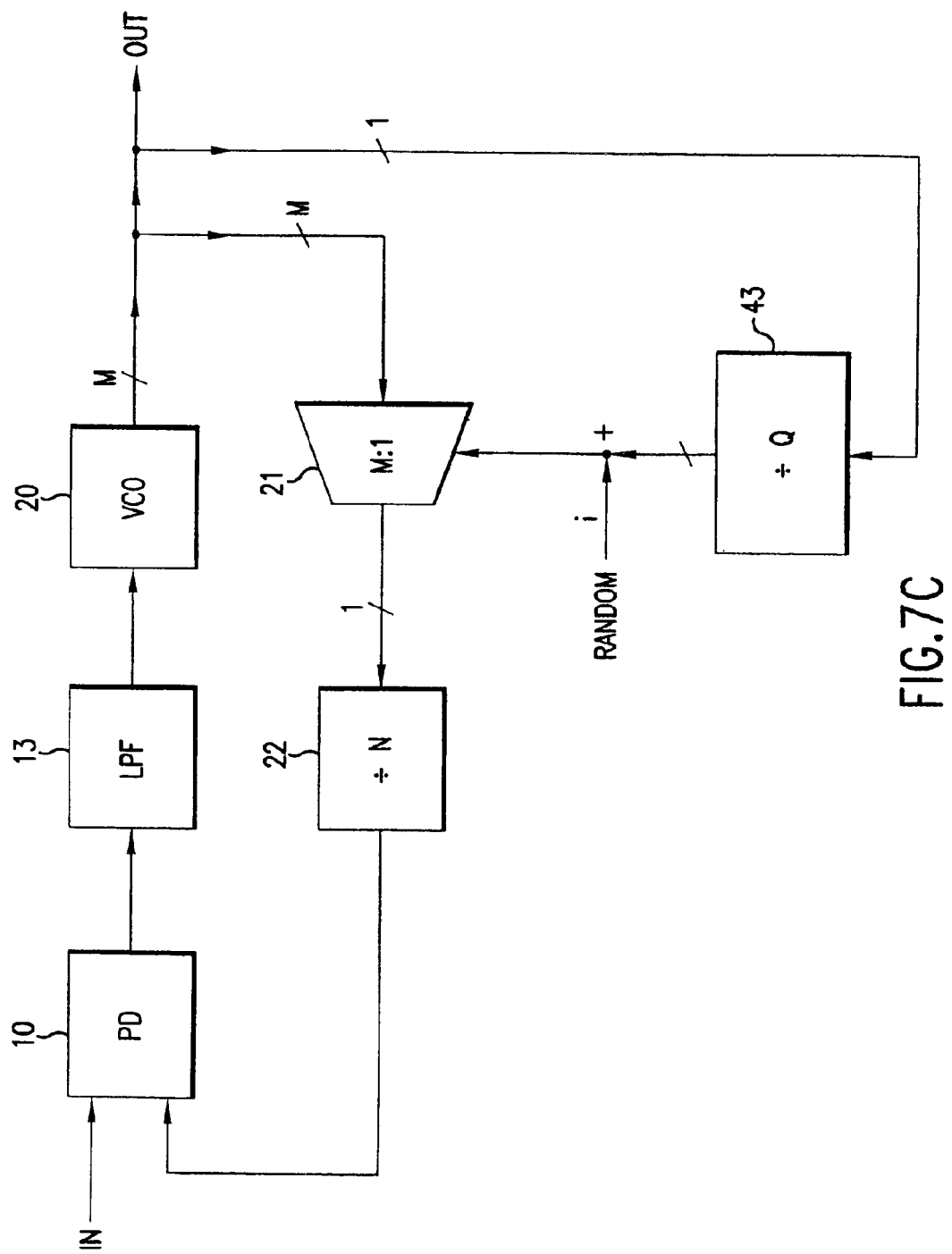
FIG. 7C is a semi-schematic simplified circuit diagram of a modified PLL using the random number generator of FIG. 7A.

Alternatively, a combination of the above two approaches is used, that is, at random time intervals, a random number is added to the value of the counter to shift the phase in random. As shown in FIG. 7B, the above three approaches spread the quantization noise over the frequency spectrum, rather than at one frequency corresponding to K/M. It should be noted that since the average of the random numbers generated is zero, the average shift in phase is one cycle every K cycles. FIG. 7C is a simplified circuit diagram of the modified PLL using the random number generator of FIG. 7A. In one embodiment, the random number generator is used in combination with the modified PLL of FIG. 2, where the MUX is at the output of the VCO.

Figure 8A:
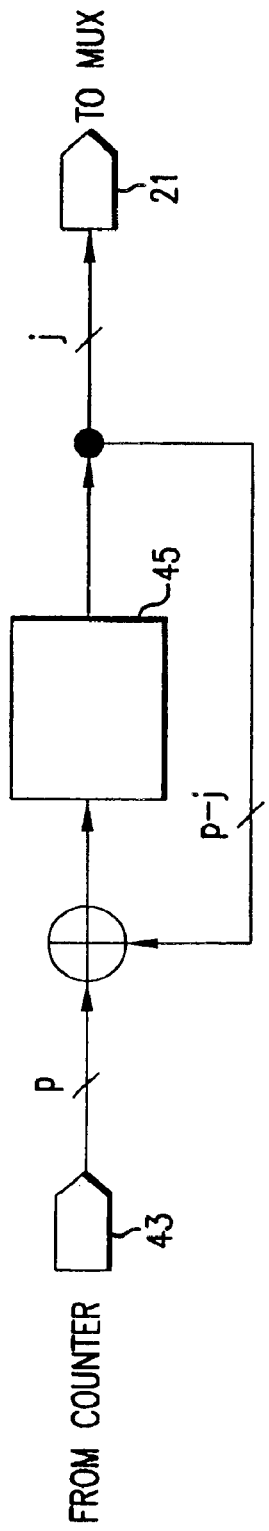
FIG. 8A is a simplified representation of a quantizer using an integrator in accordance to one embodiment of the present invention.

FIG. 8A depicts yet an exemplary function of the quantizer circuitry 44. Assuming $2^p$=Q, the output of the divide-by-Q circuit 43 is fed to a quantizer. For this example, an integrator 45 with a transfer function of $Z^{-1}/(1-Z^{-1})$ is used, however, other types of noise shaping blocks may also be used.

Figure 8B:
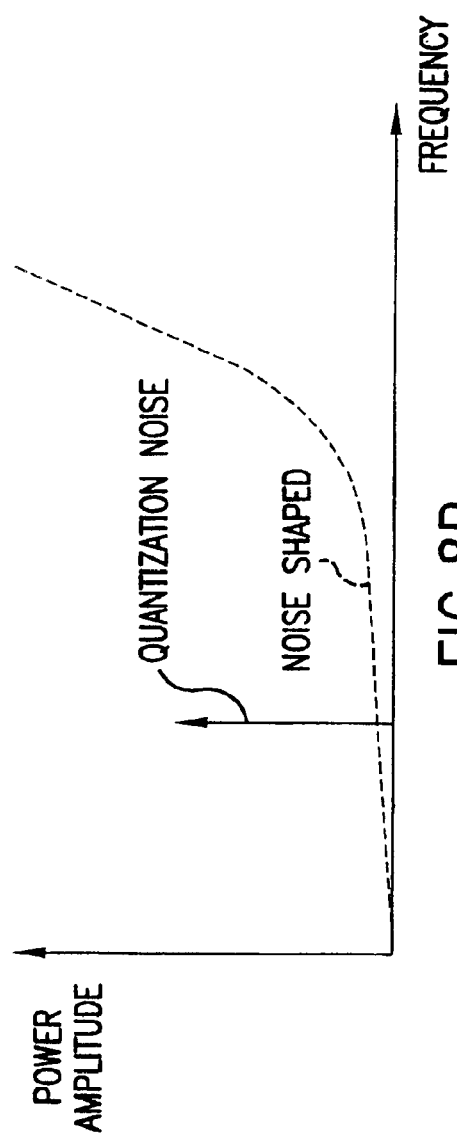
FIG. 8B is a simplified plot of frequency vs. noise energy for the quantizer of FIG. 8A.
Figure 8C:
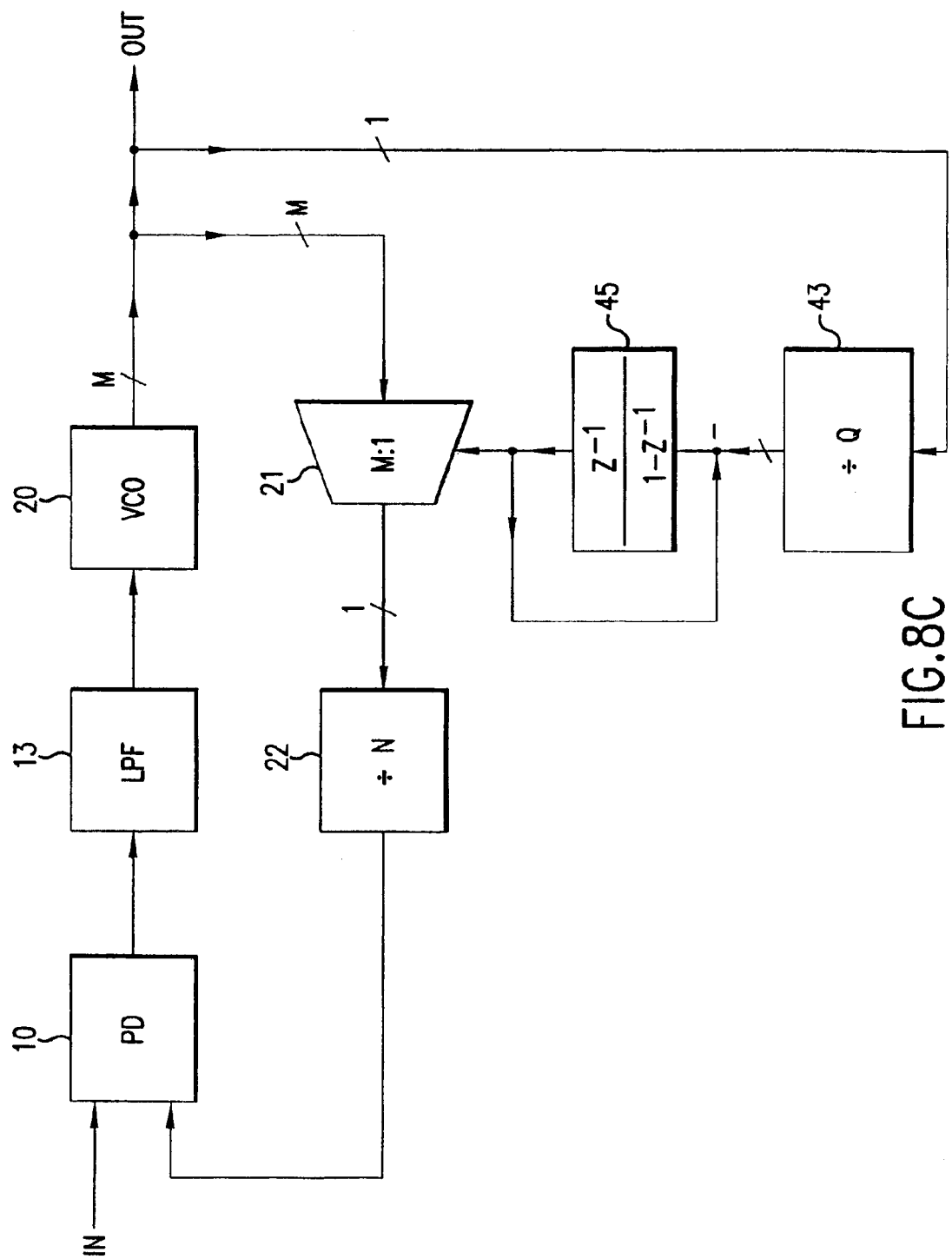
FIG. 8C is a semi-schematic simplified circuit diagram of a modified PLL using the integrator of FIG. 8A.

Then, p-j output of the integrator is fed back and is subtracted by the k-bit output of the divide-by-Q circuit 43, while j MSB bits of the filter output are truncated and used to control the MUX 21 in FIG. 8C. This is an example of noise shaping using the well-known Sigma-Delta technique. In a Sigma-Delta technique, noise is shifted in frequency domain. As shown in FIG. 8B, the quantization noise is shifted in frequency domain Although, the noise power may be amplified in this technique, the noise power is shifted to the higher frequency which is reduced significantly by the low pass loop filter 13 of the PLL. FIG. 8C is a simplified circuit diagram of the modified PLL using the integrator of FIG. 8A. In one embodiment, the noise shaping block is used in combination with the modified PLL of FIG. 2, where the MUX is at the output of the VCO.

It will be recognized by those skilled in the art that various modifications may be made to the illustrated and other embodiments of the invention described above, without departing the broad inventive scope thereof. It will be understood, therefore, that the invention is not limited to the particular embodiments or arrangements disclosed, but is rather intended to cover any changes, adaptations or modifications which are within the scope and spirit of the invention as a system for and a method of dividing or multiplying frequency by a non-integer number with minimum jitter generation by one or more of the above described schemes.

What is claimed is:

1. A method comprising:
   (a) using a phase-lock loop (PLL) to produce M clock phases from a reference signal;
   (b) producing a count signal from the M clock phases;
   (c) producing a shifted signal from the M clock phases and the count signal; and
   (d) dividing the shifted signal to produce a feedback signal that is fed back to the PLL.

2. The method of claim 1, further comprising:
   quantizing the count signal to produce a quantized signal, wherein the quantized signal in used to perform step (c).

3. The method of claim 2, wherein the quantizing step comprises using a truncator that outputs the most significant j bits of the count signal.

4. The method of claim 2, wherein the quantizing step comprises using a random number generator that adds one to or subtracts one from the count signal at a random time interval.

5. The method of claim 2, wherein the quantizing step comprises using a Sigma-Delta noise shaping method.

6. The method of claim 5, wherein the Sigma-Delta noise shaping method comprises using a noise shaping transfer function of $Z^{-1}/(1-Z^{-1})$.

7. The method of claim 1, wherein step (c) comprises using a multiplexer (MUX) to perform the producing of the shifted signal.

8. The method of claim 1, wherein step (c) further comprises:
   shifting the reference signal one phase every K/M cycles, wherein the reference signal is at least one of decreased by (K+1)/K and increased by K/(K−1).

9. The method of claim 1, wherein step (d) further comprises:
   setting a frequency of the feedback signal using a divide-by-N element.

10. The method of claim 1, wherein step (b) further comprises:
    extending a period T of the reference signal to at least one of T+T/M to perform frequency division of the reference signal and to T−T/M to perform frequency multiplication of the reference signal.

11. A method comprising:
    (a) receiving a reference signal and a feedback signal at a clock generator;
    (b) using the clock generator to generate M clock phases from at least one of the reference signal and the feedback signal;
    (c) generating a count signal from the M clock phases;

(d) generating a shifted signal from the M clock phases and the count signal; and (e) dividing the shifted signal to produce the feedback signal.

12. The method of claim 11, further comprising quantizing the count signal before it is used in step (d).

13. The method of claim 11, wherein step (d) comprises shifting the reference signal by one phase every K/M cycles.

14. The method of claim 11, wherein step (b) comprises using a phase-lock loop (PLL) as at least part of the clock generator.

15. The method of claim 11, wherein step (d) comprises using a multiplexer (MUX) that receives the M clock phases at one terminal and the count signal at another terminal to generate the shifted signal.

16. The method of claim 11, wherein step (c) further comprises extending a period of the reference signal at least to T+T/M to perform frequency division of the reference signal and to T+T/M to perform frequency multiplication of the reference signal.

* * * * *